(12) United States Patent
Shafer et al.

(10) Patent No.: US 6,956,694 B2
(45) Date of Patent: Oct. 18, 2005

(54) BROAD SPECTRUM ULTRAVIOLET INSPECTION SYSTEMS EMPLOYING CATADIOPTRIC IMAGING

(75) Inventors: David R. Shafer, Fairfield, CT (US); Yung-Ho Chuang, Cupertino, CA (US); Bin-Ming B. Tsai, Saratoga, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 258 days.

(21) Appl. No.: 10/005,732

(22) Filed: Nov. 6, 2001

(65) Prior Publication Data

US 2002/0085271 A1 Jul. 4, 2002

Related U.S. Application Data

(60) Continuation of application No. 09/596,540, filed on Jun. 16, 2000, now Pat. No. 6,313,467, which is a division of application No. 08/950,283, filed on Oct. 14, 1997, now Pat. No. 6,133,576, which is a division of application No. 08/681,528, filed on Jul. 22, 1996, now Pat. No. 5,717,518.

(51) Int. Cl.$^7$ .......................... G02B 13/14; G03B 27/42
(52) U.S. Cl. ...................... 359/356; 359/355; 359/350; 355/53
(58) Field of Search .................. 359/350–361, 359/656–662, 725–732, 850–861, 364–366; 355/47–56; 250/461.1, 458.1, 459.1, 372; 356/237.1, 237.2, 237.3, 234.4, 237.5; 438/125–127

(56) References Cited

U.S. PATENT DOCUMENTS

| | | | |
|---|---|---|---|
| 3,748,015 A | 7/1973 | Offner | 359/366 |
| 4,247,203 A | 1/1981 | Levy et al. | 356/398 |
| 4,331,390 A | 5/1982 | Shafer | 359/731 |

(Continued)

FOREIGN PATENT DOCUMENTS

| | | |
|---|---|---|
| EP | 0 204 071 | 12/1986 |
| EP | 0 405 051 | 1/1991 |
| EP | 0 628 806 | 12/1994 |
| EP | 0 736 789 | 10/1996 |
| GB | 2 158 675 | 11/1985 |
| WO | 85/00408 | 1/1985 |
| WO | 86/01096 | 2/1986 |
| WO | 86/02730 | 5/1986 |
| WO | 86/07148 | 12/1986 |

OTHER PUBLICATIONS

Offner, "Field Lenses and Secondary Axial Aberration," Applied Optics, Aug. 1969, vol. 8, No. 8, pp. 1735–1736.

*Primary Examiner*—Thong Q. Nguyen
(74) *Attorney, Agent, or Firm*—Ann Marie Mewherter; Daffer McDaniel, LLP

(57) ABSTRACT

An ultraviolet (UV) catadioptric imaging system, with broad spectrum correction of primary and residual, longitudinal and lateral, chromatic aberrations for wavelengths extending into the deep UV (as short as about 0.16 $\mu$m), comprises a focusing lens group with multiple lens elements that provide high levels of correction of both image aberrations and chromatic variation of aberrations over a selected wavelength band, a field lens group formed from lens elements with at least two different refractive materials, such as silica and a fluoride glass, and a catadioptric group including a concave reflective surface providing most of the focusing power of the system and a thick lens providing primary color correction in combination with the focusing lens group. The field lens group is located near the intermediate image provided by the focusing lens group and functions to correct the residual chromatic aberrations. The system is characterized by a high numerical aperture (typ. greater than 0.7) and a large flat field (with a size on the order of 0.5 mm). The broad band color correction allows a wide range of possible UV imaging applications at multiple wavelengths.

20 Claims, 5 Drawing Sheets

U.S. PATENT DOCUMENTS

| | | | |
|---|---|---|---|
| 4,342,503 A | | 8/1982 | Shafer .......................... 359/729 |
| 4,391,494 A | * | 7/1983 | Hershel ........................ 355/53 |
| 4,556,317 A | | 12/1985 | Sandland et al. ......... 356/237.1 |
| 4,618,938 A | | 10/1986 | Sandland et al. ............ 382/148 |
| 4,747,678 A | | 5/1988 | Shafer et al. ............... 359/366 |
| 4,749,840 A | | 6/1988 | Piwczyk ................. 219/121.68 |
| 4,779,966 A | | 10/1988 | Friedman ..................... 359/730 |
| 4,792,695 A | | 12/1988 | Blandford .............. 250/559.24 |
| 4,845,558 A | | 7/1989 | Tsai et al. .................... 348/126 |
| 4,891,663 A | * | 1/1990 | Hirose ......................... 355/53 |
| 5,031,976 A | * | 7/1991 | Shafer ......................... 359/356 |
| 5,031,977 A | * | 7/1991 | Gibson ........................ 359/355 |
| 5,034,611 A | | 7/1991 | Alpern et al. ................ 250/372 |
| 5,052,763 A | | 10/1991 | Singh et al. ................. 359/355 |
| 5,112,129 A | | 5/1992 | Davidson et al. ........... 356/497 |
| 5,161,062 A | | 11/1992 | Shafer et al. ............... 359/785 |
| 5,412,219 A | | 5/1995 | Chappelle et al. ........ 250/461.1 |
| 5,488,229 A | | 1/1996 | Elliott et al. ............. 250/492.2 |
| 5,515,207 A | | 5/1996 | Foo ............................ 359/725 |
| 6,064,517 A | | 5/2000 | Chuang et al. .............. 359/364 |

* cited by examiner

BROAD SPECTRUM ULTRAVIOLET INSPECTION SYSTEMS EMPLOYING CATADIOPTRIC IMAGING

This is a continuation of application Ser. No. 09/596,540 filed on Jun. 16, 2000, now U.S. Pat. No. 6,313,467 B1, which is a divisional application of U.S. patent application Ser. No. 08/950,283 filed on Oct. 14, 1997, now U.S. Pat. No. 6,133,576, which is a divisional application of U.S. patent application Ser. No. 08/681,528 filed on Jul. 22, 1996, now U.S. Pat. No. 5,717,518.

TECHNICAL FIELD

The present invention relates to optical systems adapted for imaging in the ultraviolet (UV) portion of the spectrum, and in particular to broadband UV catadioptric imaging optics, i.e. systems employing a combination of one or more lens elements and one or more reflecting (mirror) elements in series. The invention is addressed especially to systems that have been designed to correct for imaging and color aberrations

BACKGROUND ART

Catadioptric imaging systems for the deep ultraviolet spectral region (about 0.15 to 0.30 μm wavelength) are known. U.S. Pat. No. 5,031,976 to Shafer and U.S. Pat. No. 5,488,229 to Elliott and Shafer disclose two such systems. These systems employ lens elements made from only a single refractive material, namely fused silica, since it is practically the only material that combines good transmission of deep UV light with desirable physical properties. For example, fluoride glasses (based on $CaF_2$, LiF, etc.), while transmissive of deep UV light, are generally considered too soft, making lens formation difficult. Thus, fluoride glass materials are normally avoided whenever possible.

In the above-noted '976 Shafer patent, an optical system is disclosed, which is based on the Schupmann achromatic lens principle producing an achromatic virtual image, and which combines it with a reflective relay to produce a real image. The system, reproduced here as FIG. 7, includes an aberration corrector group of lenses 101 for providing correction of image aberrations and chromatic variation image aberrations, a focusing lens 103 receiving light from the group 101 for producing an intermediate image 105, a field lens 107 of the same material as the other lenses placed at the intermediate image 105, a thick lens 109 with a plane mirror back coating 111 whose power and position is selected to correct the primary longitudinal color of the system in conjunction with the focusing lens 103, and a spherical mirror 113 located between the intermediate image and the thick lens 109 for producing a final image 115. Most of the focusing power of the system is due to the spherical mirror 113. It has a small central hole 117 near the intermediate image 105 to allow light from the intermediate image 105 to pass therethrough to the thick lens 109. The mirror coating 111 on the back of the thick lens 109 also has a small central hole 119 to allow light focused by the spherical mirror 113 to pass through to the final image 115. While primary longitudinal (axial) color is corrected by the thick lens 109, the Offner-type field lens 107 placed at the intermediate image 105 has a positive power to correct secondary longitudinal color. Placing the filed lens slightly to one side of the intermediate image 105 corrects tertiary longitudinal color. Thus, axial chromatic aberrations are completely corrected over a broad spectral range. The system incidentally also corrects for narrow band lateral color, but fails to provide complete correction of residual (secondary and higher order) lateral color over a broad UV spectrum.

The above-noted '229 patent to Elliott and Shafer provides a modified version of the optical system of the '976 patent, which has been optimized for use in 0.193 μm wavelength high power excimer laser applications, such as ablation of a surface 121', as seen in FIG. 8. This system has the aberration corrector group 101, focusing lens 103', intermediate focus 105', field lens 107', thick lens 109', mirror surfaces 111' and 113' with small central openings 117' and 119' therein and a final focus 115' of the prior '976 patent, but here the field lens 107' has been repositioned so that the inter-mediate image or focus 105' lies outside of the field lens 107' to avoid thermal damage from the high power densities produced by focusing the exciter laser light. Further, both mirror surfaces 111' and 113' are formed on lens elements 108' and 109'. The combination of all light passes through both lens elements 108' and 109' provides the same primary longitudinal color correction of the single thick lens 109 in FIG. 7, but with a reduction in total glass thickness. Since even fused silica begins to have absorption problems at the very short 0.193 μm wavelength, the thickness reduction is advantageous at this wavelength for high power levels. Though the excimer laser source used for this optical system has a relatively narrow spectral line width, the dispersion of silica near the 0.193 μm wavelength is great enough that some color correction still needs to be provided. Both prior systems have a numerical aperture of about 0.6.

Longitudinal chromatic aberration (axial color) is an axial shift in the focus position with wavelength. The prior system seen in FIG. 7 completely corrects for primary, secondary and tertiary axial color over a broad wavelength band in the near and deep ultraviolet (0.2 μm to 0.4 μm). Lateral color is a change in magnification or image size with wavelength, and is not related to axial color. The prior system of FIG. 7 completely corrects for primary lateral color, but not for residual lateral color. This is the limiting aberration in the system when a broad spectral range is covered.

An object of the invention is to provide a catadioptric imaging system with correction of image aberrations, chromatic variation of image aberrations, longitudinal (axial) color and lateral color, including residual (secondary and higher order) lateral color correction over a broad spectral range in the near and deep ultraviolet spectral band (0.2 to 0.4 μm).

In addition to color correction, it is also desired to provide a UV imaging system useful as a microscope objective or as microlithography optics with a large numerical aperture for the final image and with a field of view of at least 0.5 mm. The system is preferably telecentric.

SUMMARY OF THE INVENTION

The object is met with a catadioptric imaging system in which an achromatic multielement field lens is used, made from two or more different refractive materials, such as fused silica and fluoride glass. The field lens may be a doublet or preferably a triplet, which may be cemented together or alternatively spaced slightly apart. Because fused silica and fluoride glass do not differ substantially in dispersion in the deep ultraviolet, the individual powers of the several component elements of the field lens need to be of high magnitude. Use of such an achromatic field lens allows not only axial color, but also lateral color to be completely corrected over a broad spectral range. Only one field lens component need be of a different refractive material than the other lenses of the system.

An optical system according to the present invention includes a focusing lens group with plural lens elements, preferably all formed from a single type of material, with refractive surfaces having curvatures and positions selected to focus light to an intermediate image with high levels of correction of both image aberrations and chromatic variation of aberrations over a UV wavelength band of at least 0.20 to 0.29 µm, and preferably extending over 0.20 to 0.40 µm. Systems adapted for a UV band that includes the 0.193 µm wave-length are also possible. The system also includes the aforementioned field lens group positioned near the intermediate image to provide correction of chromatic aberrations including residual axial and lateral color. The intermediate image plane may be located either inside or outside the field lens group depending on the optimization. A catadioptric group includes a concave spherical reflector, which may either be a mirror or a reflectively coated lens element, and a planar or near planar reflector near the final image, which is a reflectively coated lens element. Both reflective elements have central optical apertures therein where reflective material is absent, allowing light from the intermediate image to pass through the concave reflector, be reflected by the planar (or near planar) reflector onto the concave reflector, and pass through the planar (or near planar) reflector, traversing the associated lens element or elements on the way, The imaging system provides a numerical aperture of at least 0.7, a large field size of about 0.5 mm and substantially flat field imaging over a broad wave length band extending into the deep UV portion of the spectrum The system is useful in a number of optical configurations, including bright field illumination, directional and ring (nondirectional) dark field illumination, fluorescence imaging, full sky scatterometer and confocal microscope configurations. UV imaging systems provide not only better optical resolutions but also better material identification due to strong variations in the reflectivity and absorption of UV light by materials, strong scattering (proportional to $\lambda^{-4}$), higher orders of diffraction, and fluorescence in the UV spectrum Broad band UV imaging systems can have UV lamps as light sources, which provide incoherent light for no speckle imaging, and which enable other special imaging techniques, such as Nipkow disk type confocal microscopy, to be used in the UV spectrum. Possible applications for the broad band/deep UV objective lens include wafer and photomask inspection, material masking and cutting applications, UV lithography, biological microscopy, metallurgical microscopy, spectroscopic analysis of specimen materials, and others.

BEST MODE OF CARRYING OUT THE INVENTION

Figure 1:
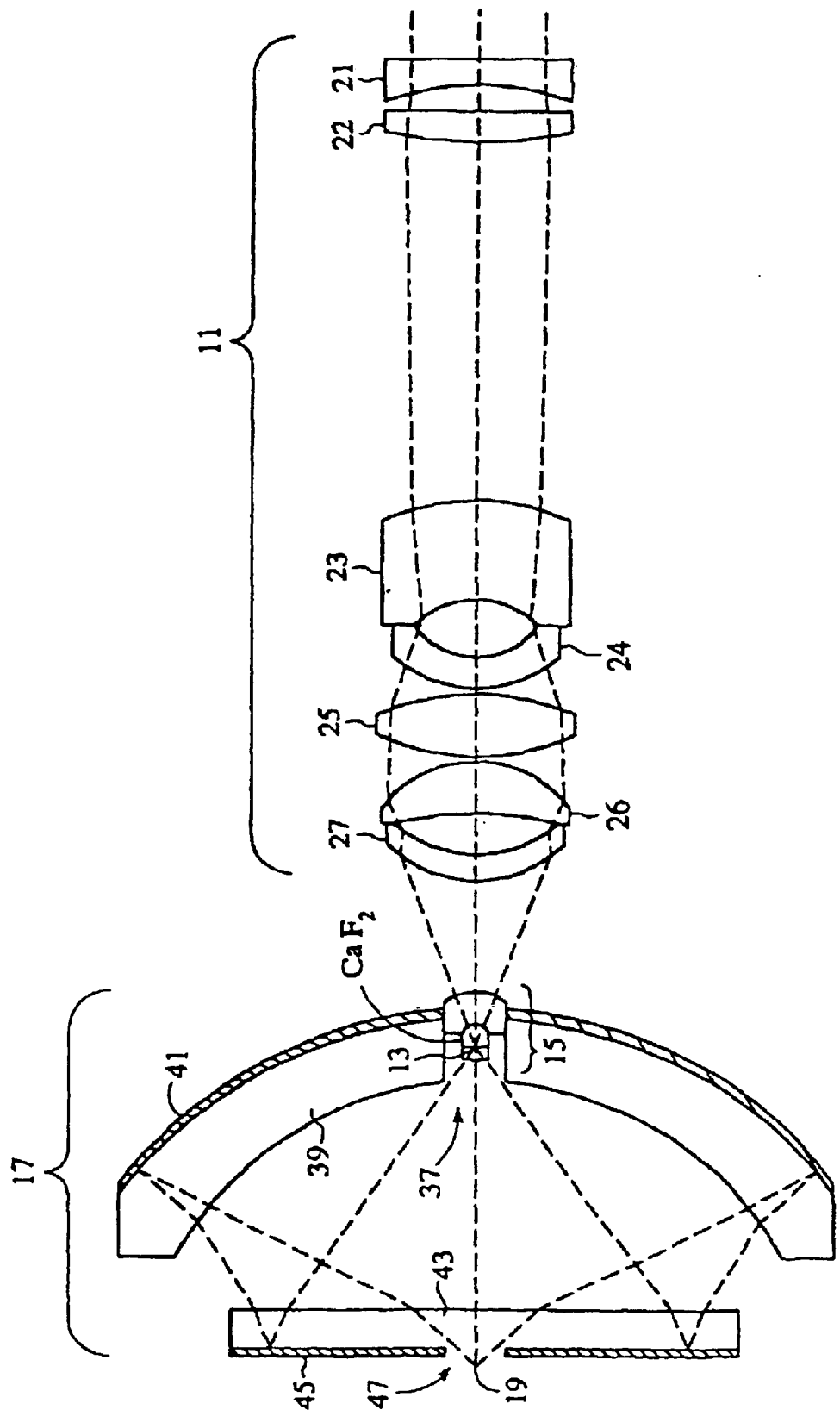
FIG. 1 is a schematic side view of a catadioptric imaging system in accord with the present invention.

With reference to FIG. 1, a catadioptric imaging system of the present invention, which is especially suited for use in broad-band deep-ultraviolet applications, is made up of a focusing lens group 11 forming an intermediate image 13, a field lens group 15 disposed proximate to the intermediate image 13 for providing correction of chromatic aberrations, and a catadioptric group 17 focusing the light from the intermediate image 13 to a final image 19. The imaging system is optimized to correct both monochromatic (Seidel) aberrations and chromatic aberrations (longitudinal and lateral), as well as chromatic variations of the monochromatic aberrations, over a wavelength band that extends into the deep ultraviolet (UV) portion of the spectrum, including at least 0.20 to 0.29 µm UV light and preferably extending over a broad band covering 0.20 to 0.40 µm UV light. Both ranges include the 0.248 µm KrF excimer laser line and the 0.248 µm and 0.254 µm mercury emission lines. The broader spectral range also includes the 0.365 µm mercury emission line (commonly known as the i-line), the 0.351 µm XeF excimer laser line, and the 0.325 µm He—Cd laser line. A wide assortment of other laser and arc lamp emission wavelengths in the ultraviolet are also available. The system could also be adapted to provide chromatic-aberration-corrected imaging over other UV wavelength ranges For example, a 0.19 to 0.40 µm wavelength band that includes the 0.193 µm ArF excimer laser line is also possible. Narrower bands might also be used. The catadioptric system of the present invention can be adapted for a number of UV imaging applications, including as a UV microscope objective, a collector of surface scattered UV light in a wafer inspection apparatus, or as mask projection optics for a UV photolithography system.

The focusing lens group 11 in FIG. 1 consists of seven lens elements 21–27, with two of the lenses 21 and 22 separated by a substantial distance from the remaining five lens elements 23–27. In particular, the separation of the pair of lenses 21 and 22 from the remaining five lens elements 23–27 in this focusing lens group is typically on the order of at least one-half the total combined thickness of the five lens elements 23–27 forming the main focusing subgroup. For example, lens elements 23–27 may span a distance of about 60 mm and lens element 22 may be 30 to 60 mm from lens element 23. The actual dimensions depend on the scale chosen for the design The two lenses 21 and 22 form a zero-power doublet for the correction of chromatic variation of monochromatic image aberrations, such as chromatic variation of coma and astigmatism. By having this doublet 21 and 22 relatively far from the rest of the system components, the shift of he light beam on these two lenses with field angle is maximized. That, in turn, helps greatly in achieving the best correction of chromatic variation of aberrations. The five lenses 23–27 of the main focusing subgroup in FIG. 1 consist of a thick strong negative meniscus lens 23, an opposite-facing strongly-curved negative meniscus lens 24, a strong biconvex lens 25, a strong positive meniscus lens 26, and an opposite-facing strongly-curved, but very weak, meniscus lens 27 of either positive or negative power. Variations of this subgroup of lens 23–27 are possible The subgroup focuses the light to an intermediate image 13. The curvature and positions of the lens surfaces are selected to minimize monochromatic aberrations and also to cooperate with the doublet 21–22 to minimize chromatic variations of those aberrations.

Figure 2:
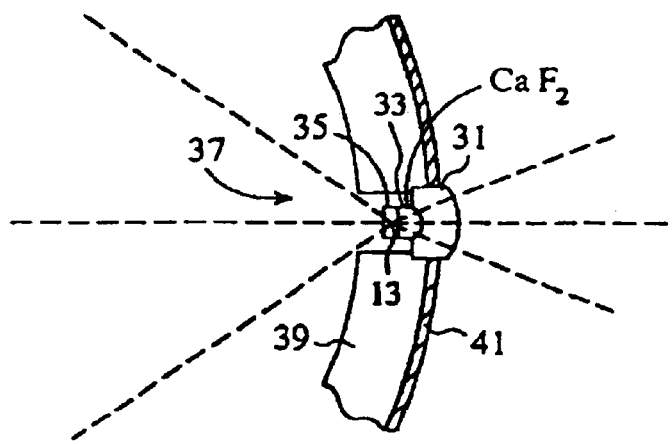
FIG. 2 is an enlarged portion of the imaging system of FIG. 1 in the vicinity of the intermediate image 13 showing elements of an achromatic field lens group for the system.
Figure 3:
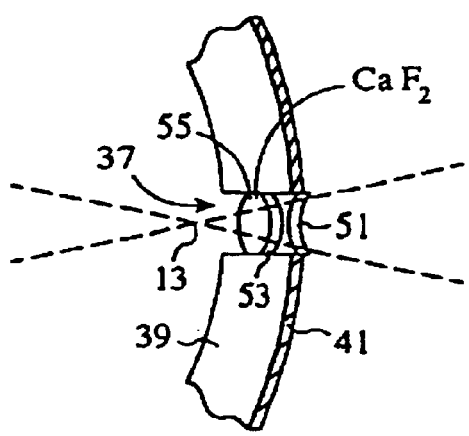
FIG. 3 is an enlarged portion, comparable to FIG. 2, of a catadioptric imaging system in accord with the present invention showing elements of an alternative achromatic field lens group for the system.

The field lens group 15, seen in an expanded view in FIG. 2, typically comprises an achromatic triplet, although a doublet might also be used. Both fused silica and $CaF_2$ glass materials are used. Other possible deep UV transparent refractive materials can include $MgF_2$, $SrF_2$, $LaF_3$ and LiF glasses, or mixtures thereof. Note, however, that some of these materials can be birefringent if they are not completely amorphous and contain microcrystals. Because the dispersions between the two UV transmitting materials, $CaF_2$ glass and fused silica, are not very different in the deep ultraviolet, the individual components of the group 15 are quite strong The triplet 15 may comprise a fused silica negative meniscus lens 31, a $CaF_2$ biconvex (positive) lens 33 and a fused silica biconcave (negative) lens 35, all cemented together. The optimized design for this configuration places the intermediate image 13 inside the triplet group 15. Alternatively, as seen in FIG. 3, the achromatic field lens group may comprise two fused silica, opposite facing negative meniscus lenses 51 and 53, spaced slightly apart (typ. about 1.0 mm), followed by a $CaF_2$ biconvex (positive) lens 55 nearly abutting the second of the meniscus lenses 53. The optimized design for this second configuration allows the intermediate image 13 to be formed outside the field lens group 15 beyond the $CaF_2$ lens. Either embodiment of the field lens group 15 has surface curvatures and positions selected to correct residual (secondary and tertiary) axial and lateral color. Primary color aberrations are corrected mainly by the lens elements in the catadioptric group 17 in combination with the focusing lens group 11. Use of two or more different refractive material types in the field lens groups, such as both fused silica and $CaF_2$ glass, allows residual lateral color to be completely corrected, in addition to the axial color corrections provided by prior single-material field lenses.

As seen in FIGS. 2 and 3, the intermediate focus 13 may be located either inside or outside of the field lens group 15. If the intermediate image 13 is inside the group 15, maximum aberration correction is achieved. Alternatively, it may be desirable to have the image 13 outside the field lens group 15 in cases where there is danger that high optical power densities nay cause damage to the glass material of one or more of the field lens elements Furthermore, small imaging errors due to glass inhomogeneities are less of a factor when the field lens group 15 is placed somewhat away from the intermediate image 13.

The catadioptric group 17 seen in FIG. 1 includes a first optical element consisting of a fused silica meniscus lens 39 with a concave reflective surface coating 41 on a back surface of the lens 39, and also includes a second optical element consisting of a fused silica lens 43 with a reflective surface coating 45 on a back surface of the lens 43. (The front surfaces of the two lens elements 39 and 43 of the catadioptric group 17 face each other.) The reflective surface coatings 41 and 45 are typically composed of aluminum, possibly with a $MgF_2$ overcoat to prevent oxidation. Aluminum has a nearly uniform reflectivity of at least 92% over the entire near and deep UV wavelength range. Other metals commonly used as reflective coatings in the visible portion of the spectrum have reflectivities that vary considerably with wavelength or even become opaque in the deep UV. For example, silver drops to only 4% reflectivity at 0.32 $\mu m$. Possible alternative to aluminum, but with somewhat lower reflectivities near 60%, include molybdenum, tungsten and chromium. These may be favored in certain high power applications, such as laser ablation. Specialized coatings, including long-wave pass, short-wave pass and band pass dichroic reflective materials, partially transmissive and reflective material coatings, and fluorescent coating, could all be used for a variety of specialized applications.

The first lens 39 has a hole 37 centrally formed therein along the optical axis of the system. The reflective coating 41 on the lens surface likewise ends at the central hole 37 leaving a central optical aperture through which light can pass unobstructed by either the lens 39 or its reflective coating 41. The optical aperture defined by the hole 37 is in the vicinity of the intermediate image 13 so that there is minimum optical loss. The achromatic field lens group 15 is positioned in or near the hole 37. The second lens 43 does not normally have a hole, but there is a centrally located opening or window 47 on the surface reflective coating 4a where the coating is absent, leaving another optical aperture at the central window location 47. The optical aperture in lens 39 with its reflective coating 41 need not be defined by a hole 37 in the lens 39, but rather could simply be defined by a window in the coating 41 where reflective coating material is absent, just as with lens 43 and coating 45. In that case, light would pass one additional time through the refractive surfaces of lens 39.

The coated mirror 45 may be either flat or preferably slightly curved. The slight curvature will provide some centering tolerance for that element, whereas a planar mirror 45 has no such tolerance, making precise alignment more critical. Moreover, if the reflective element 45 is slightly curved, it will make contact with a wafer surface or other object to be imaged by the catadioptric system less likely and avoid the damage to both mirror coating 45 and the object which would result from any such contact.

Light from the intermediate image 13 passes through the optical aperture 37 in the first lens 39 then through the body of the second lens 43 where it is reflected back through the body of the second lens 43 by the planar or near planar mirror coating 45 on the back surface of the lens 43. The light then passes through the first lens 39, is reflected by the mirror surface 41 and passes back through the body of the first lens 39. Finally the light, now strongly convergent passes through the body of the second lens 43 for a third time, through the optical aperture 47 to the final image 19. The curvatures and positions of the first and second lens surfaces are selected to correct primary axial and lateral color in conjunction with the focal lens group 11.

The optical elements may be assembled with or without cemented interfaces. Cementing lens elements simplifies assembly, resulting in a less expensive objective. It also results in a more robust device in which the cemented elements are far less likely to go out of alignment. Moreover, the cementing process can be used to seal environmental sensitive materials, such as the $CaF_2$ field lens element between other elements. On the other hand, since the polymeric materials used as cement in lens systems can be damaged by deep UV light possibly leading to degradation of the optical system and providing uncertain lifetime in some high power UV applications, non-cemented systems will be preferred in those high power deep UV system applications where long-term reliability is a significant issue. This is an important consideration in the selection of a cemented or non-cemented design for the field lens group elements located near the intermediate image where UV radiation is most concentrated Specific values for two examples of optimized broad-band system designs, one for the field lens group of FIG. 2 and the other for the alternate field lens group of FIG. 3, follow. The lens surface data are based on refractive index values (relative to air) for the wavelengths 0.200, 0.220, 0.245, 0.290 and 0.400 μm. The resulting designs have a numerical aperture of about 0.9 and a field size of about 05 mm diameter. Variations of the design can be done for a slightly lower numerical aperture, for example about 0.7, but with a much longer working distance, by simply reoptimizing the surface curvatures for the desired parameters. Such a variation would be suitable for reticle inspection, where longer working distances are preferred. Likewise, with slight adjustments to the surface curvatures, and allowing for a narrower wavelength band over which longitudinal and lateral are corrected, the system can be optimized to include 0.193 μm ArF excimer laser light over a wide band of 0.19 to 0.40 μm or over a narrower band.

Lens Data (Embodiment #1)

| Surface # | Radius of Curvature (mm) | Spacing (mm) | Material |
|---|---|---|---|
| 1 | 1105.7 | 4.000 | fused silica |
| 2 | 53.051 | 2.500 | air |
| 3 | 284.061 | 5.000 | fused silica |
| 4 | −57.181 | 60.000 | air |
| 5 | 39.782 | 15.000 | fused silica |
| 6 | 13.379 | 7.977 | air |
| 7 | −12.955 | 5.169 | fused silica |
| 8 | −17.192 | 1.000 | air |
| 9 | 42.964 | 8.000 | fused silica |
| 10 | −55.269 | 1.000 | air |
| 11 | 18.436 | 8.000 | fused silica |
| 12 | 91.574 | 6.253 | air |
| 13 | −20.802 | 4.000 | fused silica |
| 14 | −21.768 | 17.120 | air |
| 15 | 7.217 | 5.494 | fused silica |
| 16 | 2.259 | 3.000 | $CaF_2$ glass |
| 17 | −11.760 | 1.500 | fused silica |
| 18 | 373.721 | 39.730 | air |
| 19 | flat | 7.000 | fused silica |
| 20 | flat | −7.000 | reflector/fused silica |
| 21 | flat | −36.000 | air |
| 22 | 50.470 | −9.500 | fused silica |
| 23 | 64.290 | 9.500 | reflector/fused silica |
| 24 | 50.470 | 36.000 | air |
| 25 | flat | 7.000 | fused silica |
| 26 | flat | 1.500 | air |

Lens Data (Embodiment #2)

| Surface # | Radius of Curvature (mm) | Spacing (mm) | Material |
|---|---|---|---|
| 1 | −67.007 | 4.000 | fused silica |
| 2 | 50.308 | 2.000 | air |
| 3 | 120.297 | 6.000 | fused silica |
| 4 | −37.494 | 30.636 | air |
| 5 | 24.138 | 10.000 | fused silica |
| 6 | 13.441 | 9.532 | air |
| 7 | −13.518 | 7.546 | fused silica |
| 8 | −17.997 | 1.000 | air |
| 9 | 34.465 | 6.000 | fused silica |
| 10 | −517.022 | 1.000 | air |
| 11 | 18.268 | 10.000 | fused silica |
| 12 | 965.352 | 4.181 | air |
| 13 | −30.177 | 9.746 | fused silica |
| 14 | −28.138 | 7.892 | air |
| 15 | −19.346 | 2.500 | fused silica |
| 16 | −36.530 | 1.000 | air |
| 17 | 6.687 | 5.026 | fused silica |
| 18 | 2.044 | 0.017 | air |
| 19 | 2.044 | 2.000 | $CaF_2$ glass |
| 20 | −90.635 | 36.108 | air |
| 21 | −908.968 | 7.000 | fused silica |
| 22 | −1000.0 | −7.000 | reflector/fused silica |
| 23 | −908.968 | −36.000 | air |
| 24 | 48.244 | −9.500 | fused silica |
| 25 | 63.204 | 9.500 | reflector/fused silica |
| 26 | 48.244 | 36.000 | air |
| 27 | −908.968 | 7.000 | fused silica |
| 28 | −1000.0 | 1.500 | air |

Figure 4:
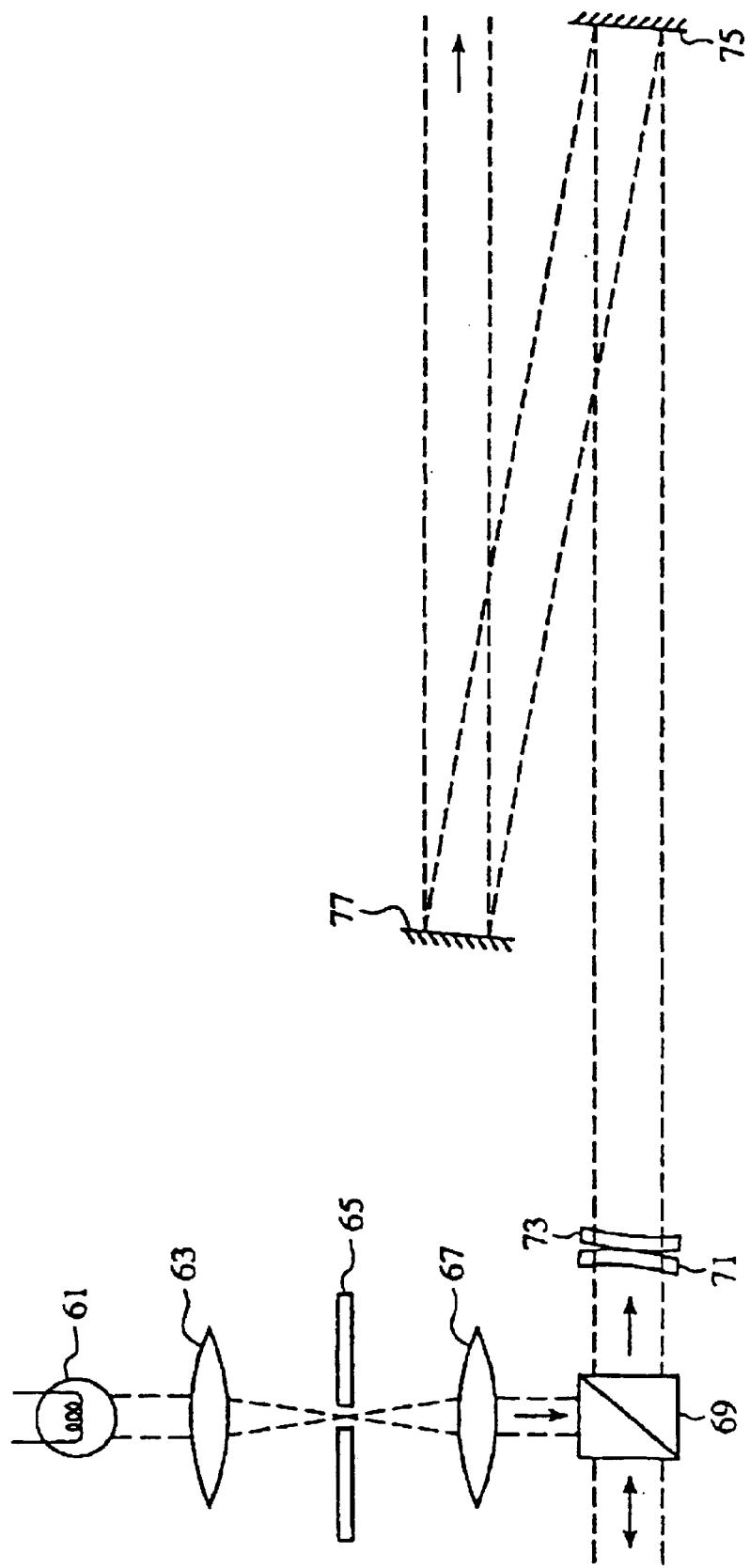
FIG. 4 is a schematic side view of a catadioptric tube lens designed to accompany the imaging system of FIG. 1 when used as an infinity-corrected microscope objective.

With reference to FIG. 4, a tube design for using the imaging system of FIG. 1 as a microscope objective is shown. Illumination of a sample surface being imaged by the objective of FIG. 1 may be made through the object itself, by means of an ultraviolet light source 61, such as a mercury vapor lamp or excimer laser, together with conventional illumination optics 63, 65, 67, leading to a beamsplitter 69 in the objective's optical path. The imaging path for light received from the objective of FIG. 1 is via transmission through the beamsplitter 69 to a microscope tube, whose design may also be caradioptric. The tube elements include a pair of opposite facing negative meniscus lenses 71 and 73 closely spaced to one another, and two spherical mirrors 75 and 77 spaced from each other and from the pair of lenses 71 and 73 by at least 400 mm. The curvature of mirror 75 is concave toward the lenses 71 and 73 and the mirror 77, while the curvature of mirror 77 is convex toward the mirror 75, both curvatures being at least 1000 mm radius, i.e. nearly flat. The mirrors 75 and 77 fold the optical path off-axis so that the system length is under 500 mm. One example optimized for the particular objective seen in FIG. 1 has the, following characteristic refractive and reflective surfaces for optical elements 71, 73, 75, and 77:

| Surface # | Radius of Curvature (mm) | Spacing (mm) | Material |
|---|---|---|---|
| 1 | −92.965 | 4.989 | fused silica |
| 2 | −96.420 | 1.000 | air |
| 3 | 89.440 | 4.616 | fused silica |
| 4 | 87.394 | 413.186 | air |
| 5 | −1219.4 | −413.186 | reflector |
| 6 | −1069.7 | 463.186 | reflector |

Figure 5:
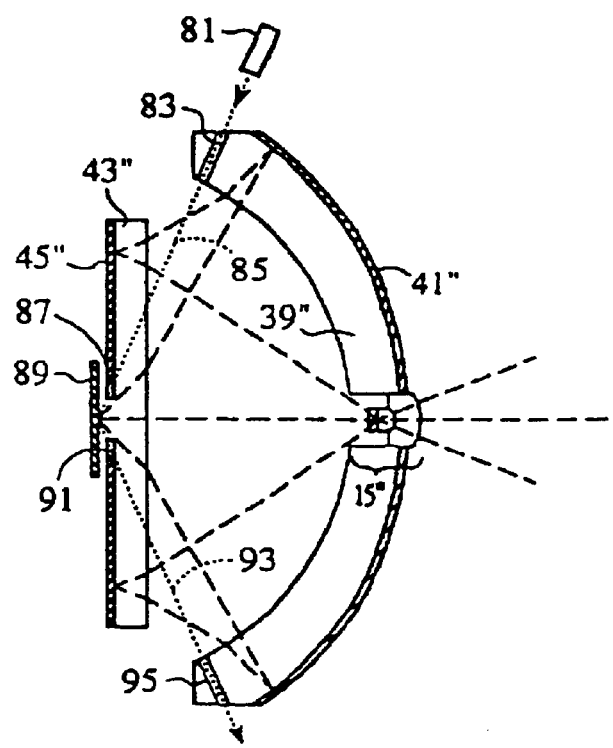
FIG. 5 is a schematic side view of a portion of a catadioptric imaging system in accord with the present invention used for a dark-field light scatter imaging wafer inspection device, showing an oblique laser beam illumination source.

Referring now to FIG. 5, yet another use for the imaging system of FIG. 1 is for wafer inspection, namely as a directional dark field, scattered light collector. A UV laser illumination source 81 directs a beam 85 through holes 83 and 87 formed in lenses 39" and 43" and reflective coating 41" and 45" of the catadioptric group onto a surface 89 to be inspected. Alternatively, only the reflective coating 41" and 45" might be absent or only partially reflective to form transparent or at least partially transmissive windows for the light beam 85. The beam 85 might also enter the system from below the hemispherical reflector 41". The angle of incidence is oblique, i.e. at least 60° from vertical due to the high numerical aperture (about 0.90) of the imaging system. Illumination may be done from more than one direction and angle of incidence. The specularly reflected light 93 passes through holes 91 and 95 formed in lenses 39" and 41" and reflective coatings 41" and 45" of the catadioptric group (or in the coatings 41" and 45" only). UV light scattered by features on the sample surface 89 are imaged by the catadioptric imaging system of FIG. 1, beginning with the catadioptric group, then through the achromatic field lens group, and focusing lens group, to the tube elements 71, 73, 75 and 77 of the tube system (absent the illumination group 61, 63, 65, 67 and 69).

Ring dark field illumination can be used instead of the directional dark field illumination of FIG. 5. In that case, a ring illumination source, such as a ring shaped flash lamp, shines a ring or partial ring of light through a Patching hole or partially reflective area of the coating in the hemispherical reflector. This can be done for more than one angle of incidence of light on the object to be observed.

In yet another alternate embodiment, the objective can be used as a dome scatterometer. The reflective components in such a system may be coated with long pass, short pass or bandpass, diffuse, fluorescent coatings. The optical components themselves are then imaged onto a set of detectors placed around the hemispheric reflector to measure the full sky scattering pattern from the fluorescent emission of the coatings. Alternatively, a dichroic or partially reflective and partially transmissive hemispheric mirror coating would allow direct measurement of scattered light transmitted through the coating.

Figure 6:
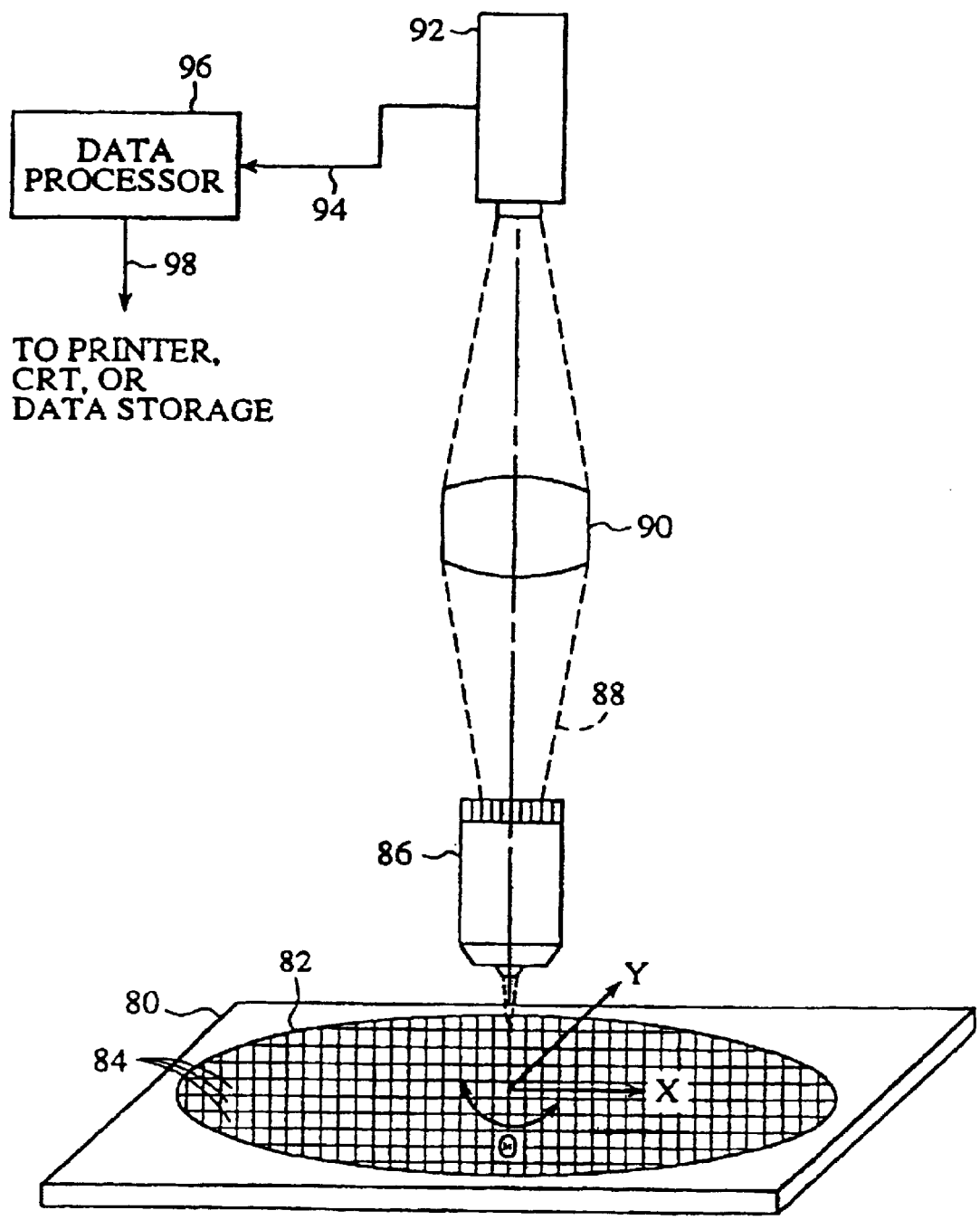
FIG. 6 is a schematic side view of a wafer inspection apparatus employing the catadioptric imaging system of the present invention as a UV objective of the inspection apparatus.
Figure 7:
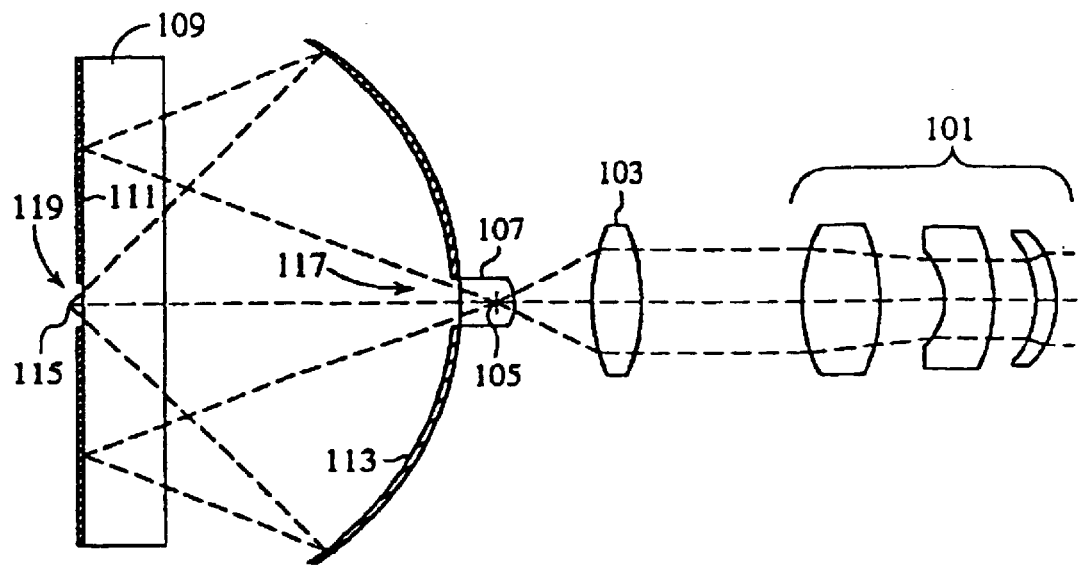
FIGS. 7 and 8 are schematic side views of catadioptric imaging systems of the prior art.
Figure 8:
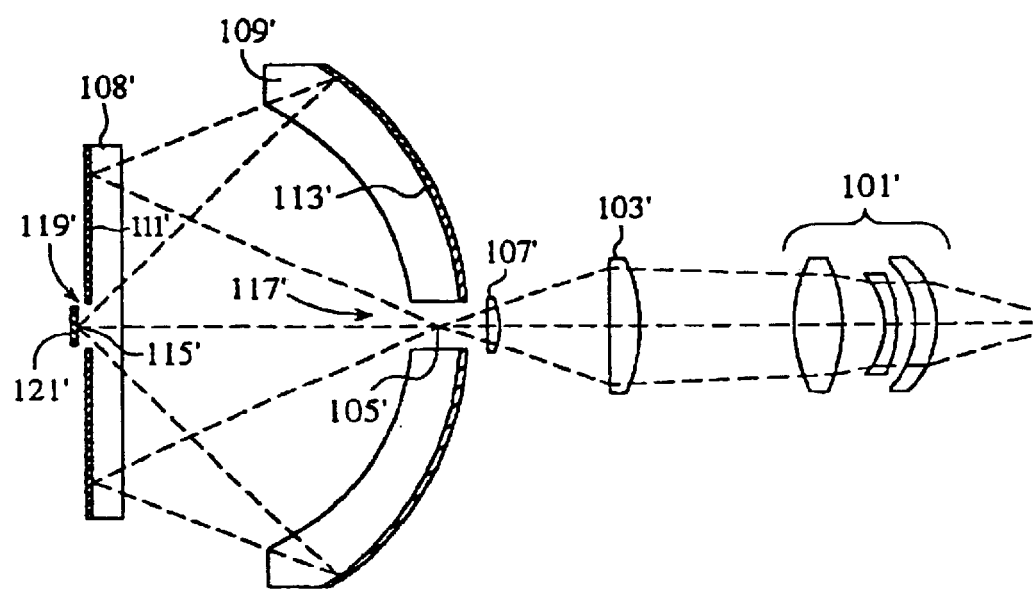

FIG. 6 shows a wafer inspection apparatus that can use the catadioptric imaging system as a UV objective 86 for the apparatus. The apparatus may be constructed according to one or more of U.S. Pat. Nos. 4,247,203; 4,556,317; 4,618,938; and 4,845,558 of the assignee of the present invention. A semiconductor wafer 82 with a plurality of integrated circuit die 84 at some stage of formation on the wafer 82 is shown lying in a carrier or stage 80. The stage 80 is capable of providing movement of the wafer 82 with translational X and Y and rotational θ motion components relative to a UV microscope objective 86, such as the catadioptric imaging system seen in FIG. 1. Light 88 collected from a die 84 or a portion of a die and formed into a magnified image of that die or portion by the objective 86 is transferred through a relay lens or lens system 90, such as the tube lens system seen in FIG. 4, into the aperture of a video or CCD array camera 92 sensitive to deep UV light. The output 94 of the camera 92 is fed into a data processor 96, which compares pixel data relating to the UV image of the die or die portion either to data corresponding to other portions of the image or to stored data from previous images relating to the die or other die portions. The results of this comparison are fed as data 98 to an output device, such as a printer or a CRT display, or to a data storage unit.

One advantage of the broad band UV objective lens of the present invention with lateral color correction is its large field size of about 0.5 mm diameter, compared to prior narrow band UV lenses that have a field size on the order of 0.1 mm or less. This provides a field with at least 25 times greater area, allowing for high speed inspection of a wafer surface, reticle or similar object. Inspections that previously took 20 to 30 minutes to complete can now be done in about one minute. The new lens also has a significantly flattened field, which is a must for surface viewing and inspection. Note that no broad band UV objective previously exists. The current Zeiss Ultrafluor 100x objective needs tuning a ring and refocus in order to be used at a specific wavelength.

However, the most important advantage is the objective's multi-wavelength capability. Prior UV objectives are relatively narrow band designs in which good performance is limited to single wavelength sources, because of significant chromatic aberrations over wavelength bands as small as 10 nm in the deep UV (e.g., near 248 nm). In many applications, multi-wavelength sources, such as Xenon flash lamps and arc lamps, are the preferred light source, due to their low cost and absence of coherent artifacts. Such sources demand primary and residual longitudinal and lateral color correction over a broader wavelength band of at least 20 nm, and preferably over 100–200 nm wide bands. In other cases, multiple light sources at widely different wavelengths may be used in a single system, again demanding broad band color correction in the UV spectrum.

For a wafer fab facility with both i-line (365 nm) and deep UV 248 nm-based steppers, the broad band UV lens of the present invention enables a reticle inspection system to have selectable i-line or 248 nm wavelength illumination to match the exposure wavelength for which a reticle or mask has been constructed. Such wavelength matching is important, for example, for inspecting advanced phase shifting masks. Likewise, the broad band UV lens of the present invention allows for construction of a system with selectable wavelength for improved inspection of photoresist on wafers. Photoresist is a material that is transparent to visible light, providing low contrast for inspection at those wavelengths. However, photoresist becomes opaque at the shorter UV wavelengths with different resists becoming opaque at different wavelengths. Thus, waters with i-line photo-resist can be inspected with high sensitivity at a wavelength of about 313 nm, where it is opaque. Wafers with deep UV (248 nm) photoresist can be inspected at a different wavelength around 220 nm. The lens system of the present invention allows the same inspection apparatus to inspect both kinds of photoresist.

In a similar fashion, multiple wavelength imaging of UV light can help in understanding the observed image. For example, different materials vary in their reflectivities at different UV wavelengths. That is, they have what by analogy to color in visible light might be termed "UV color". Most metals other than aluminum become opaque, while silicon becomes more reflective in deep UV light. If combined with a UV camera having a UV photodetector imaging array and a combination of wavelength selective UV transmission filters, the broad band UV objective lens of the present invention can be used to provide a "UV color" image of the object being inspected. This would be useful in defect and feature classification on a wafer. The UV imaging array can be made, for example, with $Cs_2Te$, $Cs_3Sb$, $K_2CsSb$ or GaAsP detector elements. Silicon-based back-thinned or microlens array CCDs have also been developed for UV imaging.

Likewise, a system can be built that analyzes materials based on fluorescence. Many materials, including most organic materials, such as photoresists, fluoresce, but they respond to different excitation wavelengths and they emit at different fluorescence wavelengths. With the broad band UV imaging lens of the present invention, a fluorescence detection system can be built with adjustable wavelength from about 0.2 to 0.4 μm. By analyzing the fluorescence wavelength, the compositions of the materials being observed can be determined. The UV reflective components of the catadioptric system can be coated with long pass, short pass, or bandpass dichroic coatings to image the fluorescence signals while rejecting the reflected or scattered excitation light.

The depth of focus of an optical system (proportional to wavelength and inversely proportional to the square of the system's numerical aperture) is intrinsically very short in the ultraviolet spectrum (typically on the order of 0.1 to 0.5 $\mu$m). This can create a problem in imaging patterned wafers and other similar surfaces with nonplanar profiles. With the broadband UV optics of the present invention, we can use multiple UV wavelength imaging at different depths and computer software integration of the resulting images to extend the depth of focus to about 1 $\mu$m. For example, we can scan the surface of a wafer or other object at three different UV colors with about a 10 to 50 nm wavelength separation (e.g., at 0.20, 0.22 and 0.24 $\mu$m) using three different focal planes for the different wavelengths to image different slices of the surface. A confocal microscope configuration with the UV objective of the present invention and with three detectors having corresponding bandpass filters could be used for this purpose. The three images can then be integrated by a computer to produce a composite with the increased depth of focus. The small depth of focus of the high N.A. lens systems can also be used to advantageously produce high resolution image slices at various depths than can be integrated to form a 3-D image.

The UV objective lens of the present invention is useful in many different microscopy techniques, including the previously mentioned bright field, dark field and fluorescence techniques, as well as phase contrast, polarization contrast, differential interference contrast and other techniques. For example, the system may be used in a confocal microscope geometry using a UV lamp and full field imaging instead of a scanning laser device. Some or all of these techniques can be used simultaneously or in sequence within the same objective lens

What is claimed is:

1. A broad band ultraviolet achromatic catadioptric inspection system, comprising a broad band ultraviolet objective configured to image a first object at a first ultraviolet wavelength and to image a second object at a second ultraviolet wavelength different than the first ultraviolet wavelength, wherein the objective comprises a first lens and a second lens having different desportions, and wherein the system is configured to detect defects on the first or second object using the image of the first or second object, respectively.

2. The system of claim 1, wherein the first and second objects are selected from the group consisting of a reticle, a resist, and a semiconductor wafer.

3. The system of claim 1, wherein the first and second ultraviolet wavelengths are selected based on the first and second objects, respectively.

4. The system of claim 1, wherein the first and second objects comprise different materials, and wherein the first and second ultraviolet wavelengths are selected based on reflectivities of the different materials at different ultraviolet wavelengths.

5. The system of claim 1, wherein the first and second ultraviolet wavelengths are selected from the group consisting of 193 nm, 248 nm, and 365 um.

6. The system of claim 1, wherein the first and second ultraviolet wavelengths are separated by about 10 nm to about 50 nm.

7. The system of claim 1, the first or second object comprises a reticle, and wherein the first or second ultraviolet wavelength is an exposure wavelength for which the reticle has been constructed.

8. The system of claim 1, wherein the first and second objects comprise different resists, and wherein the first and second ultraviolet wavelengths comprise about 313 nm and about 220 nm, respectively.

9. The system of claim 1, wherein a field size of the objective is about 0.5 mm diameter.

10. The system of claim 1, wherein the objective has a significantly flattened field.

11. The system of claim 1, wherein the objective corrects primary and residual longitudinal and lateral color over a wavelength band of at least 20 nm.

12. The system of claim 1, wherein the objective further comprises a focusing lens group configured to focus ultraviolet light at an intermediate image, a field lens group disposed proximate the intermediate image, wherein the field lens group comprises the first lens and the second lens, and a catadioptric relay group configured to form a final image of the intermediate image.

13. The system of claim 1, further comprising an excimer laser configured to illuminate the first and second objects with ultraviolet light at the first and second ultraviolet wavelengths, respectively.

14. The system of claim 1, wherein the objective is further configured to image the first and second objects with light scattered by the first and second objects, respectively.

15. The system of claim 1, further comprising a ring dark field illumination source configured to illuminate the first and second objects with ultraviolet light at the first and second ultraviolet wavelengths, respectively.

16. The system of claim 1, wherein the system is further configured to classify defects and features on the first or second object using the image of the first or second object, respectively.

17. A broad band ultraviolet achromatic catadioptric inspection system, comprising:

a broadband ultraviolet light source configured to illuminate a first object with a first ultraviolet wavelength and to illuminate a second object with a second ultraviolet wavelength different then the first ultraviolet wavelength; and a broad band ultraviolet objective configured to image the first object at the first ultraviolet wavelength and to image the second object at the second ultraviolet wavelength, wherein the objective comprises a first lens and a second lens having different dispersions, and wherein the system is configured to detect defects on the first or second object using the image of the first or second object, respectively.

18. The system of claim 17, wherein the first or second object comprises a reticle, and wherein the first or second ultraviolet wavelength is an exposure wavelength for which the reticle has been constructed.

19. The system of claim 17, wherein the objective is further configured to image the first and second objects with light scattered by the first and second objects, respectively.

20. The system of claim 17, wherein the light source comprises an excimer laser.

* * * * *

UNITED STATES PATENT AND TRADEMARK OFFICE
CERTIFICATE OF CORRECTION

PATENT NO.        : 6,956,694 B2
APPLICATION NO.   : 10/005732
DATED             : October 18, 2005
INVENTOR(S)       : Shafer et al.

It is certified that error appears in the above-identified patent and that said Letters Patent is hereby corrected as shown below:

In the Claims:

Col. 11:
line 45, delete "desportions" and substitute therefor --dispersions--.
line 62, delete "365 um" and substitute therefor --365 nm--.

Col. 12, line 45: delete "then" and substitute therefor --than--.

Signed and Sealed this

Nineteenth Day of September, 2006

JON W. DUDAS
*Director of the United States Patent and Trademark Office*